US008917380B2

(12) United States Patent
Loopstra et al.

(10) Patent No.: US 8,917,380 B2
(45) Date of Patent: Dec. 23, 2014

(54) LITHOGRAPHIC APPARATUS AND METHOD

(75) Inventors: Erik Roelof Loopstra, Eindhoven (NL);
Sven Pekelder, Breugel (NL);
Han-Kwang Nienhuys, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 285 days.

(21) Appl. No.: 13/442,458

(22) Filed: Apr. 9, 2012

(65) Prior Publication Data

US 2012/0281193 A1 Nov. 8, 2012

Related U.S. Application Data

(60) Provisional application No. 61/474,064, filed on Apr. 11, 2011.

(51) Int. Cl.
*G03B 27/54* (2006.01)
*G03B 27/42* (2006.01)
*G03F 7/20* (2006.01)

(52) U.S. Cl.
CPC ........ *G03F 7/70916* (2013.01); *G03F 7/70808* (2013.01); *G03F 7/70933* (2013.01)
USPC .......................................................... 355/67

(58) Field of Classification Search
CPC .... G03F 7/20; G03F 7/70808; G03F 7/70916

USPC ........... 355/30, 53, 67–71; 359/365, 858, 859
See application file for complete search history.

(56) References Cited

U.S. PATENT DOCUMENTS

| | | | |
|---|---|---|---|
| 6,757,051 B2 * | 6/2004 | Takahashi et al. | 355/67 |
| 7,502,095 B2 | 3/2009 | Jacobs et al. | |
| 8,018,650 B2 * | 9/2011 | Mann | 359/366 |
| 2005/0117134 A1 * | 6/2005 | Nagasaka et al. | 355/30 |
| 2006/0221314 A1 | 10/2006 | Jacobs et al. | |

FOREIGN PATENT DOCUMENTS

| | | |
|---|---|---|
| CN | 1841212 | 10/2006 |
| CN | 101713864 | 5/2010 |

* cited by examiner

*Primary Examiner* — Hung Henry Nguyen
(74) *Attorney, Agent, or Firm* — Pillsbury Winthrop Shaw Pittman LLP (57) ABSTRACT

A lithographic apparatus includes a projection system that includes a plurality of reflective optics. One of the reflective optics is provided with an opening which passes through the reflective optic. The opening is closed by a covering layer that is substantially transparent to EUV radiation. The covering layer prevents contamination from entering the projection system, while allowing patterned EUV radiation to pass from the projection system onto a substrate.

13 Claims, 7 Drawing Sheets

LITHOGRAPHIC APPARATUS AND METHOD

CROSS-REFERENCE TO RELATED APPLICATIONS

This application claims the benefit of priority from U.S. Provisional Patent Application No. 61/474,064, filed Apr. 11, 2011, the content of which is incorporated herein by reference in its entirety.

FIELD

The present invention relates to a lithographic apparatus and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

A projection system of an EUV lithographic apparatus uses mirrors to direct radiation from a patterning device to a substrate. If contamination accumulates on the mirrors then their reflectivity will be reduced and the intensity of radiation delivered to a substrate will be reduced. This may reduce the throughput of the lithographic apparatus (i.e. the number of substrates which may be patterned per hour by the lithographic apparatus).

It may be desirable to prevent or restrict the passage of contamination into a projection system of a lithographic apparatus in a manner which is not known from the prior art.

SUMMARY

According to an aspect of the invention, there is provided a lithographic apparatus comprising a projection system that comprises a plurality of reflective optics, wherein an opening passes through one of the reflective optics and through a wall of the projection system, and wherein the opening is closed by a covering layer that is substantially transparent to EUV radiation.

The opening may be in a reflective optic that is closer to a substrate table of the lithographic apparatus than other reflective optics. The reflective optics may comprise part of the wall of the projection system. Alternatively, the wall of the projection system may be separate from the reflective optics.

The covering layer may be located at or adjacent to an outer end of the opening.

The projection system may further comprise a gas outlet configured to generate a flow of gas which suppresses the passage of contamination to the covering layer.

The gas outlet may be configured to generate the flow of gas such that it travels across the covering layer.

Walls of the projection system may comprise guiding walls that define an outwardly tapering volume configured to receive the gas after it has traveled across the covering layer.

The covering layer may be located at least part-way up the opening, and the projection system may further comprise a gas outlet configured to introduce gas into the opening outside of the covering layer.

The opening may include a protruding portion that extends beyond a wall of the projection system.

The projection system may further comprise an actuator configured to move the protruding portion away from a substrate table of the lithographic apparatus.

The lithographic apparatus may further comprise a covering layer receiving apparatus which is configured to receive the covering layer when the covering layer is removed from the opening.

The covering layer receiving apparatus may be located on a substrate table of the lithographic apparatus.

The lithographic apparatus may further comprise an actuator configured to move the covering layer towards the covering layer receiving apparatus.

According to an aspect of the invention, there is provided a lithographic apparatus comprising a projection system which comprises a plurality of reflective optics located in a chamber, wherein an opening passes through one of the reflective optics and through a wall of the projection system, and wherein the projection system further comprises a gas outlet configured to deliver gas into the chamber such that a flow of gas is established from the chamber through the opening.

According to an aspect of the invention, there is provided lithographic method comprising patterning a radiation beam using a patterning device then using a projection system to project the patterned radiation beam onto a substrate, wherein an opening passes through a reflective optic of the projection system and through a wall of the projection system, and wherein the patterned radiation beam passes through the opening before being incident upon the substrate, and wherein the opening is closed by a covering layer that is substantially transparent to EUV radiation.

The method may further comprise using a covering layer receiving apparatus to remove the covering layer from the opening and replace it with a replacement covering layer.

According to an aspect of the invention, there is provided lithographic method comprising patterning a radiation beam using a patterning device then using a projection system to project the patterned radiation beam onto a substrate, wherein an opening passes through a reflective optic of the projection system and through a wall of the projection system, and where the patterned radiation beam passes through the opening before being incident upon the substrate, and wherein gas is introduced into the projection system such that a flow of gas is established from the projection system through the opening.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
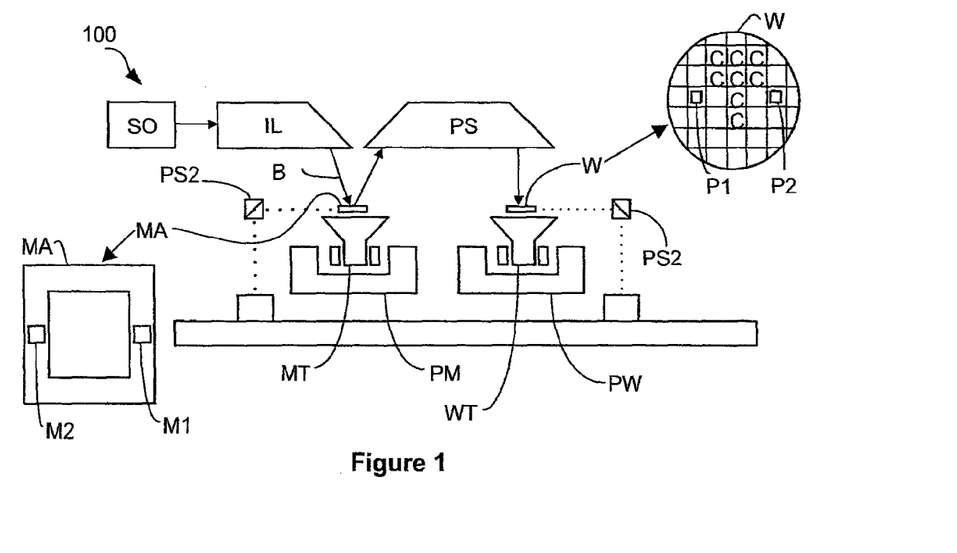
FIG. 1 depicts a lithographic apparatus according to an embodiment of the invention.

FIG. 1 schematically depicts a lithographic apparatus 100 according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb EUV radiation. A vacuum environment may therefore be provided to the beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the desired plasma can be produced by irradiating a fuel, such as a droplet, stream or cluster of material having the desired line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
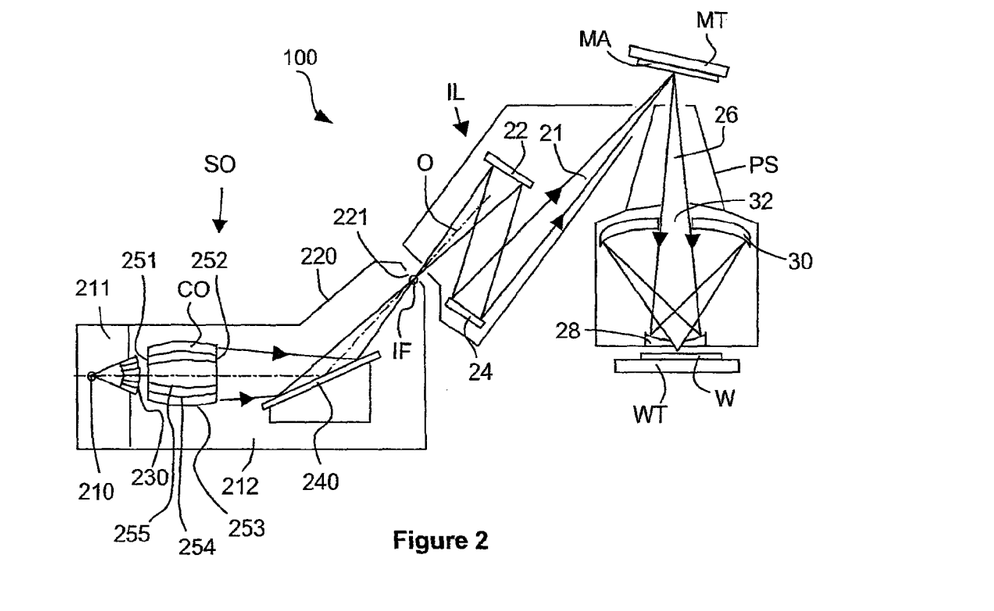
FIG. 2 is a more detailed view of the lithographic apparatus, including a discharge produced plasma source collector module.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma ("DPP") source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be used for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is desirably used in combination with a discharge produced plasma source, often called a DPP source.

Figure 3:
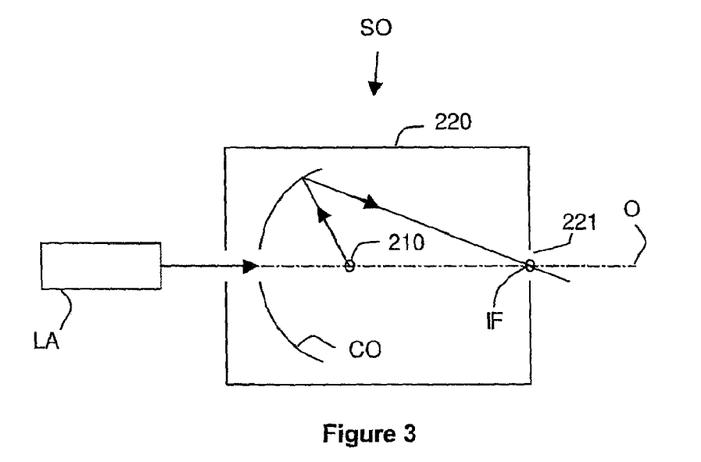
FIG. 3 is a view of an alternative source collector module of the lithographic apparatus, the alternative being a laser produced plasma source collector module.

Alternatively, the source collector module SO may be part of a laser produced plasma ("LPP") radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
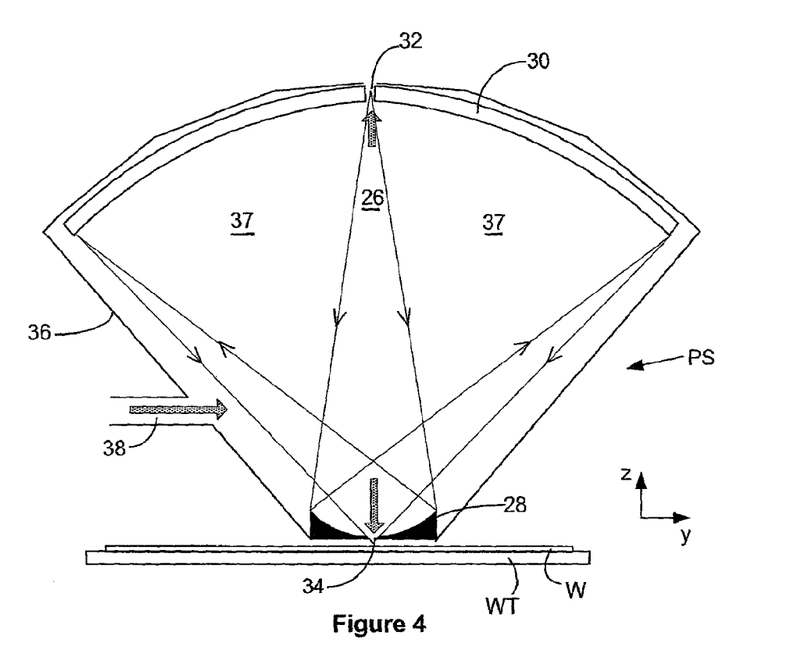
FIG. 4 schematically depicts part of a projection system of the lithographic apparatus according to an embodiment of the invention, wherein an opening passes through one of reflective optics and through a wall of the projection system.

FIG. 4 shows schematically in cross-section part of the projection system PS of the lithographic apparatus. A first mirror 28 is located beneath a second mirror 30. Both the first mirror 28 and the second mirror 30 may be concave, as is represented schematically in the Figure. Alternatively, the first and second mirrors 28, 30 may have some other suitable form, for example either or both of them may be flat, convex, or have some other more complex form. A duct or opening 32 passes through the second mirror 30. This duct or opening is referred to hereafter as the second mirror opening 32. A patterned radiation beam 26 passes through the second mirror opening 32 during operation of the lithographic apparatus. The second mirror opening 32 is also shown in FIG. 2. Although the second mirror opening 32 appears significantly larger in FIG. 2 than in FIG. 4 this is merely an artefact which arises from the schematic nature of the Figures, and the opening is not intended to be shown to scale in FIG. 2 or FIG. 4. The second mirror opening 32 may for example be dimensioned to accommodate the patterned radiation beam 26. The second mirror opening 32 may for example have sloping sides, the angle of the sloping sides being substantially matched to edges of the patterned radiation beam 26. The second mirror opening 32 may have a shape (as viewed from above or below) which generally corresponds to the shape of the radiation beam. The second mirror opening 32 may have a non-circular shape. The radiation beam may for example have an intermediate focus at the second mirror opening 32. The second mirror opening 32 may for example be a few millimeters wide. The second mirror opening 32 may for example be up to 50 millimeters long, and may for example be up to 80 millimeters long.

The first mirror 28 is configured such that it reflects the patterned radiation beam 26 towards the second mirror 30. The propagation direction of the patterned radiation beam 26 is shown by rays which schematically indicate outer edges of the patterned radiation beam. The second mirror 30 is configured such that it reflects the patterned radiation beam 26 through a duct or opening 34 which passes through the first mirror 28 and through a wall 36 of the projection system. The first mirror 28 may itself form part of the wall of the projection system (as shown schematically in FIG. 4). Alternatively, the wall of the projection system may be provided separately from the first mirror (as shown schematically in FIG. 5). The duct or opening 34 is referred to hereafter as the first mirror opening 34.

The patterned radiation is focused to an exposure slit (or other exposure area) which is incident upon a substrate W, thereby exposing a pattern onto the substrate. The first mirror opening 34 is not shown to scale in FIG. 4 (nor is it shown to scale in FIG. 2).

The first mirror opening 34 may have a non-circular shape. The first mirror opening 34 may have a shape (as viewed from above or below) which generally corresponds to the shape of the radiation beam. The first mirror opening 34 may for example be a few millimeters wide (measured at a lowermost end of the first mirror opening). The first mirror opening 34 may for example be between 7 millimeters and 70 millimeters long in the x-direction (transverse to the scanning direction), or may have some other length (measured at a lowermost end of the first mirror opening). The first mirror opening 34 may for example be between 1 millimeter and 50 millimeters wide in the y-direction (the scanning direction), or may have some other width (measured at a lowermost end of the first mirror opening). The dimensions of the first mirror opening 34 may increase further up the first mirror opening due to the first mirror opening having sloping walls which slope outwardly to accommodate the patterned radiation beam 26.

As is shown schematically in FIGS. 2 and 4, the first mirror opening 34 passes through the reflective surface of the first mirror 28. In an alternative embodiment (not illustrated) the first mirror opening may pass through a support structure which forms part of the first mirror 28 without passing through a reflective surface of the first mirror. This may be advantageous because it avoids creating an obscuration (a non-reflective area) on the first mirror 28. Both of these alternatives may be considered to be examples of the first mirror opening 34 passing through the first mirror 28.

Walls 36 of the projection system PS are indicated schematically in FIG. 4. The walls may have any suitable form and are not necessarily the shape shown in FIG. 4 (or the shape shown in FIG. 2). The walls 36 may define a chamber 37 within which a vacuum may be established and/or within which gas may be provided (the gas for example being provided at a pressure which is below atmospheric pressure). Additional walls (not illustrated) may be provided which encompass the substrate W and substrate table, and which define a volume within which a vacuum or gas at a pressure below atmospheric pressure may be provided. Similarly, additional walls (not illustrated) may be provided which encompass the patterning device MA and support structure MT (see FIG. 2), and which define a volume within which a vacuum or gas at a pressure below atmospheric pressure may be provided.

An upper surface of the substrate W may be in close proximity to the first mirror opening 34 during projection of a pattern onto the substrate. It may be desirable to prevent or restrict the passage of contamination from the substrate W into the projection system PS. Contamination may for example arise from resist present on the substrate W and could accumulate on the first and second mirrors 28, 30, causing the reflectivity of the first and second mirrors to be reduced. This is undesirable because it would reduce the intensity of the patterned radiation beam 26 at the substrate W, thereby reducing the throughput of the lithographic apparatus (i.e. the number of substrates that may be patterned per hour).

In an embodiment a gas supply may be connected to projection system PS, the gas supply being configured to deliver gas into the projection system chamber 37. The gas supply may comprise a gas outlet 38 which may for example be connected to the projection system wall 36. An arrow schematically indicates gas passing into the projection system chamber 37. The gas may for example be hydrogen. Alternatively, the gas may be helium, nitrogen, argon, or some other suitable gas. The gas may be supplied with a pressure in the range 10-100 Pa in the projection system chamber 37.

The environment surrounding the substrate W and substrate table WT may be at a pressure which is lower than the pressure in the projection system chamber 37, for example a pressure of around 2 Pa. Since the pressure within the projection system chamber 37 is higher than the pressure outside of the projection system chamber, gas will flow out of the projection system chamber through the first mirror opening 34. Similarly, the environment surrounding the patterning device MA and the support structure MT may be at a pressure which is lower than the pressure in the projection system chamber 37, for example a pressure of around 2 Pa. Since the pressure within the projection system chamber 37 is higher than the pressure outside of the projection system chamber, gas will flow out of the projection system chamber through the second mirror opening 32. The first mirror opening 34 is larger than the second mirror opening 32, and consequently more gas will flow through the first mirror opening than through the second mirror opening (assuming that the pressures outside the openings 32, 34 are equal or substantially equal). This is represented schematically in FIG. 4 by a larger arrow directed towards the first mirror opening 34 and a smaller arrow directed towards the second mirror opening 32. The flow of gas through the first mirror opening 34 prevents or restricts the passage of contamination through the first mirror opening into the projection system chamber 37.

Figure 5:
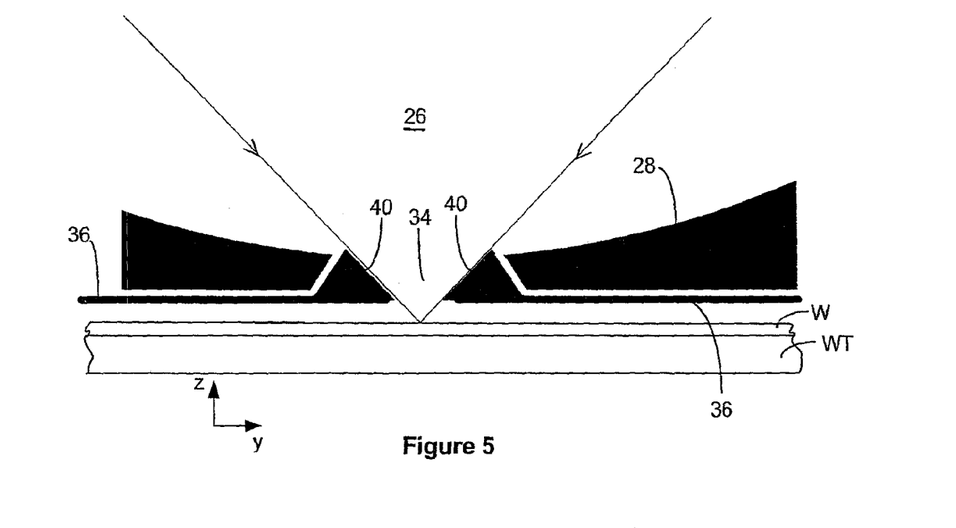
FIG. 5 depicts an embodiment of the wall of the part of the projection system of FIG. 4.

The first, mirror 28 and the first mirror opening 34 are shown in more detail in FIG. 5 together with the substrate W and the substrate table WT. As may be seen from FIG. 5, the projection system wall 36 extends beneath the first mirror 28. This may not necessarily be the case however. For example, in an embodiment the projection system wall may be partially formed by the first mirror 28. Extending the projection system wall 36 below the first mirror 28 provides the advantage that pressure is not exerted on only one side of the first mirror by the gas, thereby avoiding the possibility that such pressure causes the first mirror to deform. The projection system wall 36 may extend over the second mirror 30 (e.g. as shown schematically in FIG. 4) for the same reason, although this is not essential.

The effective size of the first mirror opening 34 is reduced by a cone wall 40 which is connected to the projection system wall 36. As a result of the cone wall 40 the first mirror opening 34 is substantially conical in cross-section, with a slope which is configured to accommodate the focussed patterned radiation beam 26. The cone wall 40 is not connected to the first mirror 28 in FIG. 5. This may be advantageous because it avoids the possibility that vibration of the projection system wall 36 is transferred to the first mirror 28. It may also avoid or reduce transmission of thermal changes from the cone wall 40 and projection system wall 36 to the first mirror. In an alternative arrangement the cone wall 40 may be connected to the first mirror 28.

The passage of gas through the first mirror opening 34 causes a Péclet driven suppression of the passage of contamination through the first mirror opening 34 into the projection system chamber 37. The effectiveness of the Péclet driven contamination suppression depends upon the length of the first mirror opening 34 (measured in the z-direction); a longer opening will provide more effective contamination suppression. For this reason, the cone wall 40 may have a height which for example extends beyond the height of the first mirror 28 at the first mirror opening. The effectiveness of the Péclet driven contamination suppression also depends upon the cross-sectional area (measured in the x and y directions) of the first mirror opening 34. For this reason, the first mirror opening 34 may have a shape and cross-section which is sufficiently large to accommodate the patterned radiation beam 26 but is not significantly larger than this (the additional area would reduce the Péclet driven contamination suppression without providing a useful purpose).

Figure 13:
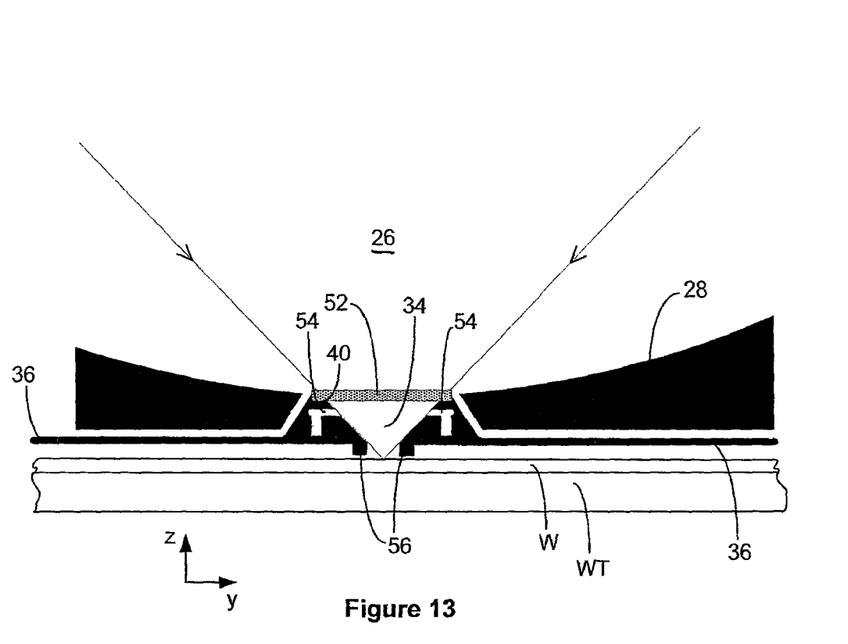
FIG. 13 depicts part of a projection system of the lithographic apparatus according to an embodiment of the invention.

A protruding portion may extend downwards from the bottom end of the cone wall 40; an example of the protruding portion is shown in FIG. 13 and schematically depicted by protruding portion 56. The protruding portion may be moveable away from the substrate table, for example in the manner described further below in relation to FIG. 13.

The cone wall 40 may be cooled in order to reduce local heating of the substrate W arising from gas which has passed through the first mirror opening 34. Similarly, parts of the projection system wall 36 may be cooled for the same reason. The cooling may be provided for example using an active cooling system such as a water-based cooling system.

The gas in the projection system chamber 37 may absorb part of the patterned radiation beam 26 (EUV radiation is absorbed by gases). However, the amount of absorption may be sufficiently low that it does not prevent productive operation of the lithographic apparatus. For example, the absorption of the EUV radiation may be less than or equal to around 30%, and may for example be in the range 5-30%. The path length travelled by the patterned radiation beam 26 in the projection system PS is a relatively small fraction of the total path length travelled by the radiation beam following its generation at the source SO (see FIGS. 1 and 2). Thus, it may be possible to accommodate the absorption arising from the gas when the gas is present in the projection system chamber 37 at a pressure in the range 10-100 Pa, and still operate the lithographic apparatus with a reasonable throughput. It might not be possible to accommodate the absorption arising from the gas and still operate the lithographic apparatus with a reasonable throughput if the gas were to be provided at a pressure in the range 10-100 Pa throughout the lithographic apparatus. Since the gas is primarily intended to provide suppression of contamination arising from the substrate W, it may be sufficient to provide gas at a pressure in the range 10-100 Pa in the projection system chamber without providing gas at that pressure in for example the illumination system IL (the projection system PS is closest to the substrate and is thus most susceptible to contamination arising from the substrate).

Figure 6:
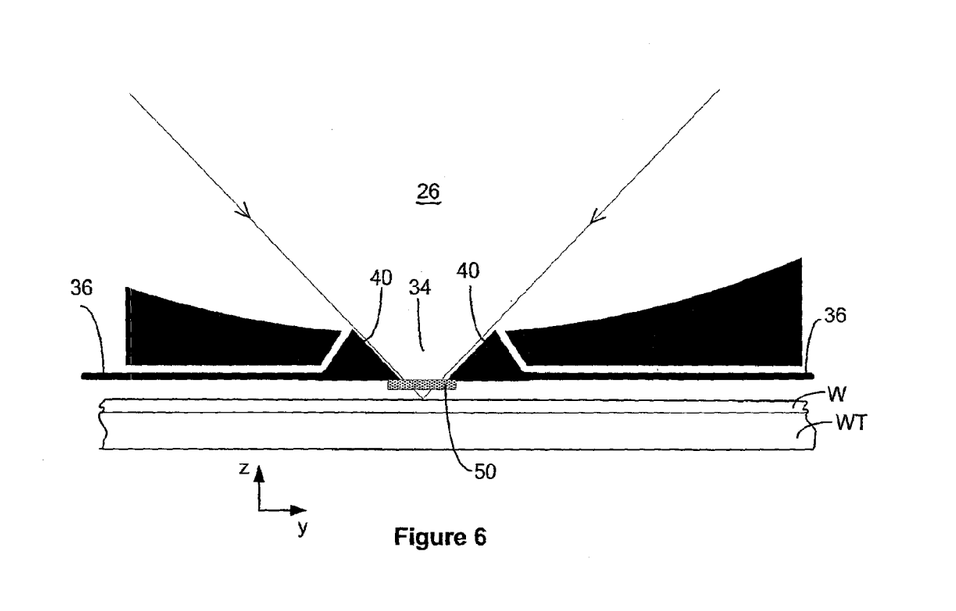
FIG. 6 depicts the part of the projection system of FIG. 4 according to an embodiment of the invention wherein the opening is closed by a covering layer.

FIG. 6 schematically shows an alternative embodiment of the invention. In this embodiment the first mirror opening 34 is closed by a covering layer 50. The covering layer 50 is substantially transparent to EUV radiation, but may absorb some EUV radiation (for example absorbing 30 percent of the EUV radiation which is incident upon it). The covering layer 50 allows the patterned radiation beam 26 to pass through the first mirror opening 34 and to be incident upon a substrate W held on a substrate table WT. The term 'substantially transparent' may be interpreted as meaning that the covering layer 50 transmits more than 50 percent of EUV radiation which is incident upon it.

The covering layer 50 closes the first mirror opening 34 and thus prevents the passage of contamination from the substrate W through the first mirror opening into the projection system PS.

A potential advantage of using the covering layer 50, compared with using contamination suppression through gas flow as shown in FIGS. 4 and 5, is that the projection system chamber may contain gas at a significantly lower pressure such that the gas absorbs significantly less EUV radiation. A potential disadvantage is that, as mentioned above, the covering layer 50 may absorb some EUV radiation. A further potential disadvantage is that the covering layer 50 may be contaminated by contaminants arising from the substrate W.

The covering layer 50 may be attached to walls 36 of the projection system and/or may be connected to the cone wall 40 (or may be attached through some other suitable structure). In the embodiment shown in FIG. 6 the covering layer 50 is at an outer end of the first mirror opening 34, although the covering layer may instead be located adjacent to an outer end of the first mirror opening or part-way up the first mirror opening. In the embodiment shown in FIG. 6 the covering layer 50 is located below the projection system wall 36 and is thus closer to the substrate W than the projection system wall.

The covering layer may for example be a sheet-like barrier of material (or materials). The covering layer 50 may be formed from silicon, graphene, Mo, Ti, Mg, Zr or their oxides or some other suitable material. The material may have a relatively high transmission for EUV radiation, and may have relatively high strength and heat conductance. The covering layer may be formed from a single material or a plurality of materials. The plurality of materials may be provided as a plurality of layers or may be mixed together. The covering layer may be supported by a support structure (not shown) such as a frame.

Contaminants which are incident upon the covering layer 50 during operation of the lithographic apparatus may adhere to the covering layer due to interaction between the contamination and EUV radiation which passes through the covering layer. Over time the accumulation of contamination on the covering layer 50 may reduce the transmission of the covering layer (i.e. more EUV radiation may be absorbed by the covering layer). This may lead to a reduction of intensity of EUV radiation incident upon the substrate and a corresponding reduction of the throughput of the lithographic apparatus. For this reason it may be beneficial to periodically clean the covering layer 50 to remove the contamination (or remove at least some of the contamination).

The covering layer 50 may be cleaned by periodically introducing hydrogen radicals into the environment in which the substrate W and substrate table WT would be located during operation of the lithographic apparatus. The introduction of hydrogen radicals may for example take place when a substrate is not present on the substrate table WT. The hydrogen radicals which are introduced into the environment may remove contamination from the covering layer 50. The hydrogen radicals may then be removed from the environment together with the contamination.

In an embodiment the covering layer 50 may be removed from the first mirror opening 34 such that it no longer closes the first mirror opening, and may be moved to a cleaning location and/or swapped with a replacement covering layer. The replacement covering layer may for example be a cleaned covering layer or a new covering layer.

Figure 7:
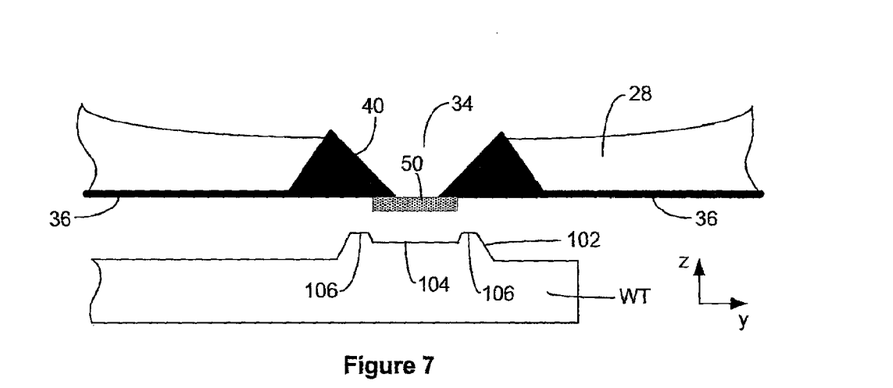
FIG. 7 depicts in cross-section an embodiment of the invention which may be used to remove the covering layer from the opening.
Figure 8:
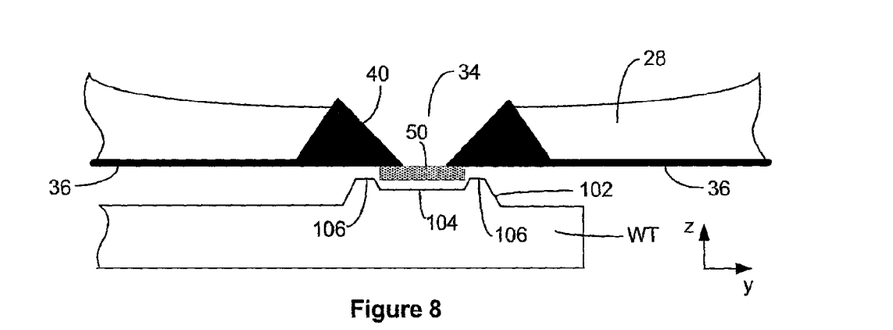
FIG. 8 depicts the embodiment of FIG. 7 wherein a receiving apparatus is moved close to the covering layer to a position arranged for release of the covering layer.
Figure 9:
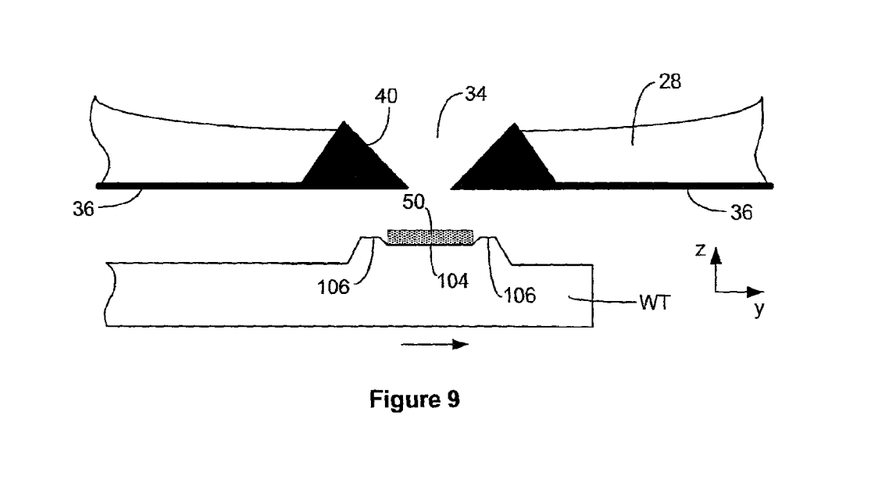
FIG. 9 depicts the receiving apparatus of FIG. 8 moved away from the projection system wall to move the covering layer to a covering layer exchange location.

FIGS. 7-9 show schematically in cross-section an embodiment of the invention which may be used to remove the covering layer 50 from the first mirror opening 34. The cone wall 40, projection system walls 36, first mirror 28 and substrate table WT are all shown in FIG. 7. The substrate table WT includes a covering layer receiving apparatus 102, which may also be referred to as a covering layer receiver. The receiving apparatus 102 extends upwardly from the substrate table WT and includes a recess 104 surrounded by a wall 106. The recess 104 is dimensioned to receive the covering layer 50, and may for example have substantially the same shape as the covering layer 50. The receiving apparatus 102 may be provided at a location on the substrate table WT which does not receive a substrate during operation of the lithographic apparatus. For example, the receiving apparatus 102 may be located at or adjacent to a corner of the substrate table WT.

During normal operation of the lithographic apparatus the receiving apparatus 102 is located away from a substrate which is being exposed, and does not interfere with operation of the lithographic apparatus. When it is desired to remove the covering layer 50 from the first mirror opening 34, the substrate table WT is moved such that the receiving apparatus 102 is located beneath the covering layer 50 (as shown in FIG. 7).

As is shown in FIG. 8, the substrate table WT is then moved upwards such that the receiving apparatus 102 is closer to the covering layer 50 but is not touching the covering layer. The covering layer 50 is then released from the projection system wall 36 and drops into the recess 104, where the covering layer may be secured to the receiving apparatus 102.

Referring to FIG. 9, the substrate table WT is then moved downwards and away from the projection system walls 36 to provide a desired clearance between the covering layer 50 and the projection system walls. Following this the substrate table WT is moved, for example in the y-direction as indicated by an arrow in FIG. 9. The covering layer 50 may for example be moved to a covering layer exchange location where the covering layer may be swapped with a replacement covering layer. The replacement covering layer may be a new covering layer, or may be a covering layer which has previously been used and which has been cleaned to remove contamination.

The replacement covering layer may be moved to beneath the first mirror opening 34 using the substrate table WT. A process which is effectively the opposite of the process described above may be used to attach the covering layer 50 to the first mirror opening 34. The process may for example comprise moving the substrate table WT upwards until the covering layer 50 is touching a bottom surface of the projection system wall 36 (or other covering layer receiving structure). A securing mechanism may then be used to secure the covering layer 50 to the projection system wall 36, after which the substrate table WT may be moved downwards and away from the covering layer.

The mechanism which is used to secure the covering layer 50 to the projection system wall 36 (or other structure) may for example be electrostatic clamping, electromagnetic clamping, magnetic clamping, or any other suitable mechanism. Similarly, the covering layer 50 may be secured to the receiving apparatus 102 using electrostatic clamping, electromagnetic clamping, magnetic clamping, or some other suitable mechanism. Alternatively, the covering layer 50 may be unsecured in the receiving apparatus 102, the covering layer being held merely by the recess 104 and wall 106 of the receiving apparatus. In an embodiment, when securing a replacement covering layer 50 to the projection system wall 36, instead of using the substrate table WT to bring the covering layer into contact with the projection system wall, the substrate table WT may be used to bring the covering layer close to the projection system wall but not into contact with the projection system wall. The projection system wall 36 (or other structure) may then attract the covering layer 50 using electrostatic attraction (or other attractive force) such that the covering layer is lifted from the receiving apparatus 102 and is drawn to the projection system wall, where it is held securely in place.

The method described above may be performed without a substrate being present on the substrate table WT. Alternatively, the method may be performed with a substrate present on the substrate table WT. Performing the method with a substrate present on the substrate table WT may allow the method to be performed without incurring a significant reduction of the throughput of the lithographic apparatus. The substrate may be exposed using the lithographic apparatus, following which the covering layer 50 may be transferred from the projection system wall 36 to the receiving apparatus 102. The substrate table WT may be swapped with a replacement substrate table upon which a substrate to be exposed is provided (as is conventional in a dual-stage lithographic apparatus), the replacement substrate table being provided with a replacement covering layer held in a receiving apparatus. The replacement covering layer may be attached to the projection system wall 36, following which exposure of the substrate may take place. In the meantime, the covering layer 50 that was removed from the projection system wall 36 may be removed from the substrate table WT (e.g. to allow it to be cleaned or replaced).

Figure 10:
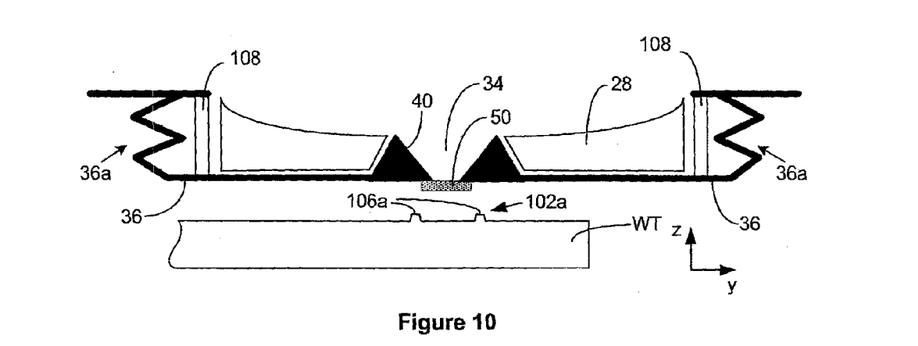
FIG. 10 depicts in cross-section an embodiment of the invention which may be used to remove the covering layer from the opening wherein actuators connected to the projection system wall are arranged to move the covering layer towards and away from a receiving apparatus.

An alternative embodiment of the invention is illustrated schematically in FIG. 10. In common with the embodiment shown in FIGS. 7-9, the substrate table WT is provided with a covering layer receiving apparatus 102a. Unlike the receiving apparatus 102 shown in FIGS. 7-9, the receiving apparatus 102a shown in FIG. 10 is not raised up from the surface of the substrate table WT, but merely comprises walls 106a which define a recess having a shape that corresponds with the shape of the covering layer 50. The receiving apparatus 102a may be raised up from the surface of the substrate table WT for example if it is desired to increase the clearance between the substrate table WT and projection system walls 36 when a covering layer is being transferred to the receiving apparatus. The degree to which the receiving apparatus 102a is raised may depend upon the size of clearance that is desired.

In the embodiment shown in FIG. 10, actuators 108 are connected to the projection system wall 36 and may be used to move the projection system wall up and down, thereby moving the projection system wall and the covering layer 50 towards and away from the receiving apparatus 102a. The projection system wall 36 includes an expandable portion 36a which comprises a series of wall pieces which are moveable relative to one another such that the angles subtended between them may change. The expandable portion 36a of the projection system wall 36 acts in an equivalent manner to walls of an accordion, and allows the projection system wall to be moved up and down while maintaining isolation between the inside and the outside of the projection system wall.

Figure 11:
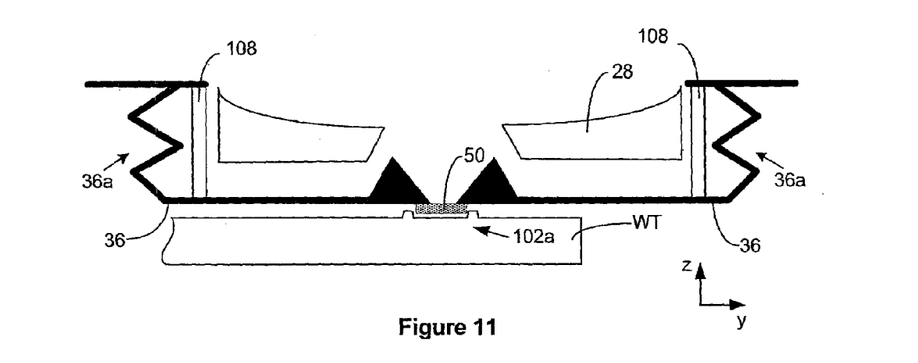
FIG. 11 depicts the embodiment of FIG. 10 wherein the projection system wall is moved downwards to move the covering layer towards the receiving apparatus.

In use, when it is desired to replace the covering layer 50, the substrate table WT is moved until the receiving apparatus 102a is located beneath the covering layer 50. The actuators 108 are then used to move the projection system wall 36 downwards, as is shown schematically in FIG. 11. The downward movement of the projection system wall 36 moves the covering layer 50 towards the receiving apparatus 102a. The covering layer 50 may come in contact with the receiving apparatus 102a, or may be located such that it is above the receiving apparatus 102a but is not touching it. The covering layer 50 may then be removed from the projection system wall 36, for example by switching off an electrostatic clamping force or other or other securing mechanism such that the covering layer 50 is free to become separated from the projection system wall 36. The covering layer 50 then drops from the projection system wall 36 into the receiving apparatus 102a.

Figure 12:
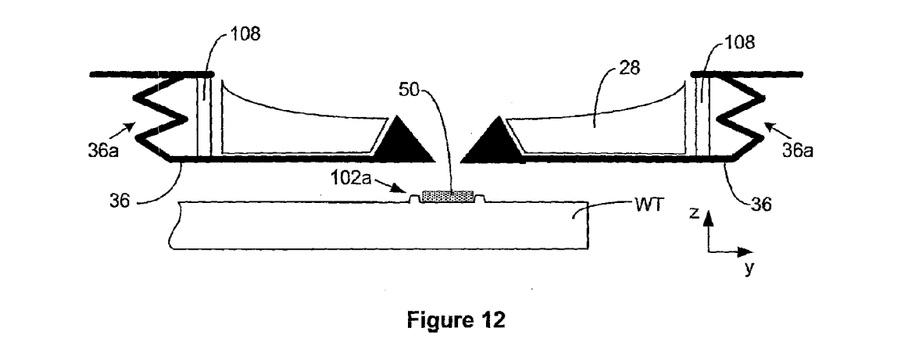
FIG. 12 depicts the embodiment of FIG. 10 wherein the covering layer is held by the receiving apparatus for movement to a covering layer exchange location.

Once the covering layer 50 has been transferred from the projection system wall 36 to the receiving apparatus 102a, the covering layer may be secured to the receiving apparatus for example using electrostatic attraction or some other securing mechanism. The actuators 108 are used to move the projection system wall 36 away from the substrate table WT, as is shown in FIG. 12. This provides clearance between the covering layer 50 and the projection system wall 36, and allows the substrate WT to be moved such that the covering layer is moved to a covering layer exchange location or other location.

The covering layer 50 may be exchanged for a replacement covering layer, which may be a new covering layer or a cleaned previously used covering layer. The replacement covering layer may be returned to the first mirror opening 34 by performing in reverse the steps described above in relation to FIGS. 10-12. In an embodiment in which the projection system wall 36 does not come sufficiently close to the receiving apparatus 102a that it touches the covering layer 50, electrostatic attraction or some other for some force may be used to bring the covering layer into contact with the projection system walls.

The method described above in relation to FIGS. 10-12 may be performed with or without a substrate being present on the substrate table WT.

In an embodiment, instead of replacing the covering layer 50 with a new or clean covering layer, the covering layer may be cleaned while it is in situ on the receiving apparatus 102, 102a. For example, the receiving apparatus 102, 102a may include one or more outlets configured to deliver a cleaning gas (e.g. hydrogen radicals) or a cleaning liquid such that it comes into contact with a lowermost surface of the covering layer 50. The receiving apparatus 102, 102a may further comprise one or more inlets and a pump(s) for removing the cleaning gas or liquid and establishing a vacuum beneath the covering layer. The receiving apparatus 102, 102a may thus be used to receive the covering layer 50, clean the covering layer and then return the covering layer to the first mirror opening 34.

An alternative embodiment of the invention is shown schematically in FIG. 13. In common with the embodiment shown in preceding Figures, the first mirror opening 34 is closed by a covering layer. However, in this case the covering layer 52 is located at or adjacent to an inner end of the cone wall 40 (the covering layer may be located at least part-way up the first mirror opening 34). The cone wall 40 is provided with gas outlets 54 which are configured to deliver gas to a portion of the first mirror opening 34 which is outside the covering layer 52 (beneath the covering layer in this embodiment). The gas outlets 54 are connected to one or more conduits (not shown) which are configured to deliver gas to the gas outlets. The conduit(s) may be located within the projection system wall 36, above the projection system wall, or may be provided at some other location. The gas which is supplied from the gas outlets 54 may be hydrogen. Alternatively, the gas may be helium, argon, nitrogen, oxygen, or some other suitable gas.

The gas flows from the gas outlets 54 into the portion of the first mirror opening 34 which is beneath the covering layer 52, and flows out of the opening 34 towards the substrate W. The gas then flows away from the first mirror opening 34, flowing between the substrate W and the projection system wall 36. The flow of the gas out of the first mirror opening 34 provides Péclet driven contamination suppression, thereby reducing the accumulation of contamination on the covering layer 52. This prevents or slows down deterioration of the transmission of the covering layer 52, thereby prolonging the useful lifetime of the covering layer 52. The first mirror opening 34 may have a shape and cross-section which is sufficiently large to accommodate the patterned radiation beam 26 but is not significantly larger than this.

The effectiveness of the Péclet driven contamination suppression depends upon the area and height of the first mirror opening 34 over which contamination suppressing gas flow occurs. For this reason, as described further above, the shape of the first mirror opening 34 may substantially correspond to the shape of the patterned radiation beam 26. In addition, the projection system wall 36 may include a protruding portion 56 which extends towards the substrate table WT. The protruding portion 56 of the projection system wall 36 increases the height of the first mirror opening 34 over which Péclet driven contamination suppression occurs, thereby reducing the accumulation of contamination at the covering layer 52. Since the protruding portion 56 is provided at the part of the first mirror opening 34 which has the narrowest diameter, the Péclet driven contamination suppression is most effective (compared with for example providing extra height at a wider part of the first mirror opening 34). The protruding portion 56 shown in FIG. 7 extends downwards directly towards the substrate table WT. In an alternative arrangement (not illustrated) the protruding portion 56 may have a sloping inner surface, for example having a slope which follows or substantially follows the outer edges of the patterned radiation beam 26. This may provide a further improvement of the Péclet driven contamination suppression provided by the gas delivered through the gas outlets 54.

Since the protruding portion 56 extends closer to the substrate W than the projection system wall 36, a gap between the protruding portion 56 and the substrate W through which the gas flows is the primary restriction of the gas flow. Any heating or cooling of the substrate W caused by the flow of gas, and any resulting deformation of the substrate, may thus be restricted to the area beneath the protruding portion 56. This is because the gap between the substrate W and the projection system wall 36 is significantly larger than the gap between the protruding portion 56 and the substrate W, and as a result the speed of flow of the gas after it has passed beyond the protruding portion may be relatively low. This may be advantageous because it limits the area over which gas-derived heating or cooling of the substrate occurs.

In an embodiment, the protruding portion 56 is connected to an actuator (not shown), which is configured to move the protruding portion 56 away from the substrate W to avoid collision between the protruding portion and the substrate. This may be done for example if the substrate W moves too close to the protruding portion 56 (e.g. due to non-flatness of the substrate and/or the substrate table WT). The protruding portion 56 may for example be retracted by the actuator at least partially into the cone wall 40. Alternatively, the actuator may move the cone wall 40 together with the protruding portion 56 (the cone wall and protruding portion for example being rigidly connected to one another). Where this is the case, the cone wall 40 may move relative to the projection system wall 36 and the first mirror 28. In an alternative embodiment, the first mirror 28 may also move away from the substrate W (e.g. in conjunction with movement of the cone wall 40 and/or other parts of the lithographic apparatus). Movement of the protruding portion 56 (optionally in combination with other parts of the lithographic apparatus) away from the substrate W may help to avoid collision between the protruding portion and the substrate, thereby avoiding damage occurring to the protruding portion or the wafer, or to other parts of the lithographic apparatus.

The gas delivered from the gas outlets 54 may be heated or cooled to compensate for or reduce thermal effects arising from the passage of the gas over the substrate W (or thermal effects arising from other mechanisms). The cone wall 40 may be heated or cooled in order to avoid or reduce thermal effects arising from the gas (or thermal effects arising from other mechanisms).

Although the flow of gas beneath the covering layer 52 may suppress the accumulation of contamination on the covering layer, some contamination may nevertheless accumulate there. Where this is the case, periodic cleaning of the covering layer 52 may be performed, for example using hydrogen radical cleaning or some other cleaning method. Cleaning of the covering layer may for example be performed when the lithographic apparatus is not operating.

In an embodiment, a covering layer may be provided at the second mirror opening 32 (see FIG. 4) instead of providing the covering layer at the first mirror opening 34. This may for example be combined with the delivery of gas into the projection system chamber 37 (as shown in FIG. 4). Where this is the case, suppression of contamination into the projection system chamber 37 is provided by the flow of gas out of the first mirror opening 34, and contamination is prevented from passing out of the second mirror opening 32 by the covering layer which closes that opening. Build up of contamination on the covering layer which closes the second mirror opening 32 may be prevented or reduced by delivering gas beneath the covering layer in a manner analogous to that described above in relation to FIG. 13. Since the second mirror opening 32 is smaller than the first mirror opening 34, the suppression of contamination accumulation on the covering layer may be stronger in the second mirror opening 32 (compared with the contamination suppression obtained using an equivalent amount of gas at the first mirror opening 34).

Figure 14:
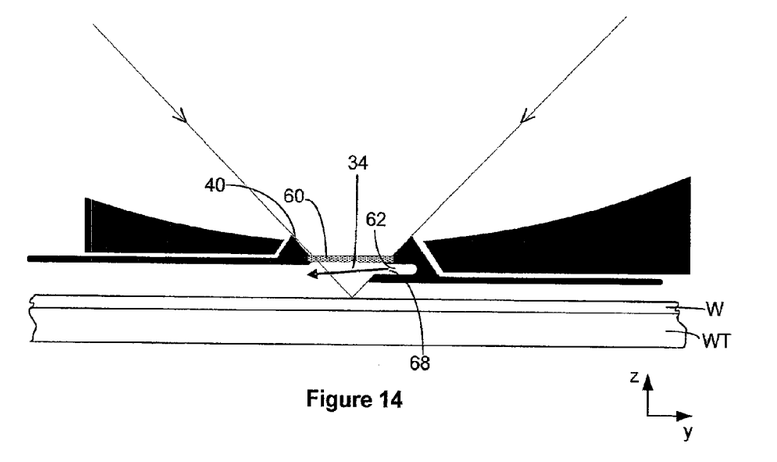
FIG. 14 depicts the embodiment of FIG. 6 wherein a gas outlet is located beneath the covering layer.
Figure 15:
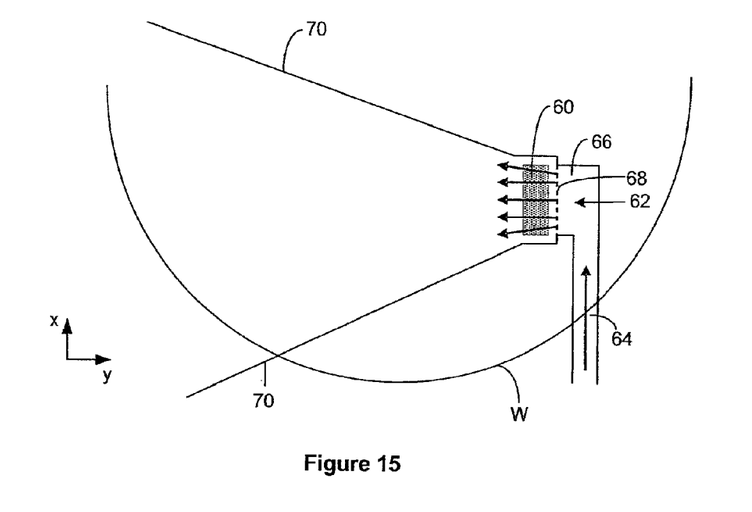
FIG. 15 shows the embodiment of FIG. 14 viewed from above in partial cross-section.

FIGS. 14 and 15 show schematically a further alternative embodiment of the invention, FIG. 14 showing the embodiment viewed in cross-section, and FIG. 15 showing the embodiment viewed from above in partial cross-section. Referring first to FIG. 14, the first mirror opening 34 is closed by a covering layer 60. The covering layer 60 prevents contamination from entering the projection system chamber 37 in the same way as described further above in relation to other embodiments. A gas outlet 62 is located beneath the covering layer 60, the gas outlet being configured to deliver gas which suppresses the accumulation of contamination on the covering layer 60. Unlike the embodiment shown in FIG. 13, the embodiment of FIG. 14 does not deliver gas from two sides of the covering layer 60, but instead delivers gas from only one side of the covering layer. The gas outlet 62 is configured to direct gas across the covering layer 60, as represented schematically by arrows.

The gas outlet 62 is shown in partial cross-section viewed from above in FIG. 15. As may be seen in FIG. 15, the gas outlet 62 comprises a conduit 64 (e.g. a pipe) connected to a chamber 66, the gas being delivered through the conduit to the chamber. Referring to FIGS. 14 and 15 in combination, the chamber 66 is provided with an outlet 68 through which the gas flows, the gas flowing from the outlet 68 to an area beneath the covering layer 60. The outlet 68 may for example run adjacent to an edge of the covering layer 60, may run along an edge of the covering layer, or may overlap with an edge of the covering layer. The outlet 68 is configured to establish a flow of gas across the lowermost surface of the covering layer 60, thereby preventing contamination from coming into contact with the covering layer or reducing the likelihood of contamination coming into contact with the covering layer.

The outlet 68 may for example comprise a slot, a plurality of holes (e.g. arranged in one or more rows as indicated schematically by a dotted line), a mesh or some other configuration.

In order to encourage the gas to flow beneath the covering layer 60 (instead of the gas for example flowing away from the covering layer), space is provided at an opposite side of the covering layer into which the gas may flow. As may be seen from FIG. 14, the space allows for example gas travelling from the outlet 68 to pass beneath the opposite side of the cone wall 40 without being blocked. To further encourage the flow of gas beneath the covering layer 60 guiding walls may project downwards from the projection system wall 36, for as shown schematically in FIG. 15. In FIG. 15, guiding walls 70 define an outwardly tapering volume into which the gas may flow. At the same time the guiding walls 70 provide a restriction which inhibits the gas from flowing in other directions.

The guiding walls 70 may comprise edges of a relatively thick portion of the projection system wall 36. This relatively thick portion of the projection system wall 36 may be sufficiently thick to accommodate the conduit 64 which delivers gas to the chamber 66.

In FIG. 15 the guiding walls 70 taper outwardly with an angle of around 45 degrees. However, the guiding walls 70 may taper outwardly with any suitable angle. The pressure provided by gas flow beneath the covering layer 60 is greatest when the angle of the guiding walls 70 is small, since the flow resistance of the volume established by the guiding walls is larger. A greater pressure may be desirable because it will be more effective in preventing or restricting passage of contamination to the covering layer 60. However, it may be desirable to reduce the pressure (by providing the guiding walls with a larger angle) in order to reduce the extent to which the pressure applies force onto the substrate W (such force may lead to distortion of the substrate). A selection of the angle of taper of the guiding walls 70 may be made by considering this trade-off.

In any of the above embodiments of the invention a cooling apparatus may be used to cool part of the lithographic apparatus if that part is liable to be heated by flowing gas used by the embodiment. A cooling apparatus may be used to cool part of the lithographic apparatus if that part is liable to be heated by for example an actuator or a securing mechanism used to secure the covering layer.

In some of the illustrated embodiments the cone wall is shown as not being mechanically connected to the first mirror. However, the cone wall may be mechanically connected to the first mirror.

In some of the illustrated embodiments the cone wall is shown as being mechanically connected to the first mirror. However, the cone wall may be not mechanically connected to the first mirror.

A cooling (or heating) apparatus may be used to heat part of the lithographic apparatus if that part is liable to be heated (or cooled) by flowing gas used by the embodiment. The heating or cooling apparatus may be active or passive.

The covering layer may be cleaned in situ using hydrogen radicals or some other suitable gas.

In an embodiment, the covering layer may be oriented at an angle relative to an optical axis of the projection system. Where this is done, heat radiated for example from a contamination particle on the covering layer may be directed away from a location at which exposure of a pattern onto a substrate is taking place, thereby reducing the extent to which the heat causes distortion of the exposure location on the substrate.

Although the first mirror opening 34 and the second mirror opening 32 are described as having a particular shape, the first mirror opening and the second mirror opening may have any suitable shape.

The term 'mirror' as used in the above description may be considered to be an example of a reflective optic. Other examples of a reflective optic may include a plurality of mirrors located adjacent to one another.

The covering layers 50, 52, 60 may be formed from silicon, grapheme, Mo, Ti, Mg, Zr or their oxides or some other suitable material. The material may have a relatively high transmission for EUV radiation, and may have relatively high strength and heat conductance. The covering layers may be formed from a combination of materials.

Cartesian coordinates are used above to facilitate description of embodiments of the invention. The Cartesian coordinates are merely intended to improve understanding of the embodiments of the invention, and are not intended to imply that the lithographic apparatus or components of the lithographic apparatus must have particular orientations.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practised otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A lithographic apparatus comprising:
    a projection system configured to project a patterned beam of radiation onto a substrate, the projection system comprising
        a plurality of reflective optics, wherein an opening passes through one of the reflective optics and through a wall of the projection system, and
        a covering layer configured to close the opening, wherein the covering layer is substantially transparent to EUV radiation.

2. The lithographic apparatus of claim 1, wherein the covering layer is located at or adjacent to an outer end of the opening.

3. The lithographic apparatus of claim 1, wherein the projection system further comprises a gas outlet configured to generate a flow of gas that suppresses the passage of contamination to the covering layer.

4. The lithographic apparatus of claim 3, wherein the gas outlet is configured to generate the flow of gas such that the gas travels across the covering layer.

5. The lithographic apparatus of claim 4, wherein walls of the projection system comprise guiding walls that define an outwardly tapering volume configured to receive the gas after the gas has traveled across the covering layer.

6. The lithographic apparatus of claim 1, wherein the covering layer is located at least part-way up the opening, and wherein the projection system further comprises a gas outlet configured to introduce gas into the opening outside of the covering layer.

7. The lithographic apparatus of claim 6, wherein the opening includes a protruding portion that extends beyond a wall of the projection system.

8. The lithographic apparatus of claim 7, wherein the projection system further comprises an actuator configured to move the protruding portion away from a substrate table of the lithographic apparatus.

9. The lithographic apparatus of claim 1, further comprising a covering layer receiving apparatus configured to receive the covering layer when the covering layer is removed from the opening.

10. The lithographic apparatus of claim 9, wherein the covering layer receiving apparatus is located on a substrate table of the lithographic apparatus.

11. The lithographic apparatus of claim 9, further comprising an actuator configured to move the covering layer towards the covering layer receiving apparatus.

12. A lithographic method comprising:
    patterning a radiation beam using a patterning device; and
    projecting the patterned radiation beam onto a substrate using a projection system, wherein an opening passes through a reflective optic of the projection system and through a wall of the projection system, wherein the patterned radiation beam passes through the opening before being incident upon the substrate, and wherein the opening is closed by a covering layer which is substantially transparent to EUV radiation.

13. The lithographic method of claim 12, further comprising removing the covering layer from the opening using a covering layer receiving apparatus, and replacing the cover layer with a replacement covering layer using the covering layer receiving apparatus.

* * * * *